(12) United States Patent
Lee et al.

(10) Patent No.: US 12,411,179 B2
(45) Date of Patent: Sep. 9, 2025

(54) BATTERY DIAGNOSING APPARATUS AND METHOD

(71) Applicant: LG Energy Solution, Ltd., Seoul (KR)

(72) Inventors: Bum-Hee Lee, Daejeon (KR); Su-Won Kang, Daejeon (KR); Han-Sol Kim, Daejeon (KR); Sang-Ki Lee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 665 days.

(21) Appl. No.: 17/604,927

(22) PCT Filed: Sep. 7, 2020

(86) PCT No.: PCT/KR2020/012050
§ 371 (c)(1),
(2) Date: Oct. 19, 2021

(87) PCT Pub. No.: WO2021/085836
PCT Pub. Date: May 6, 2021

(65) Prior Publication Data
US 2022/0179008 A1   Jun. 9, 2022

(30) Foreign Application Priority Data
Oct. 28, 2019   (KR) .................. 10-2019-0134819

(51) Int. Cl.
*G01R 31/3835*   (2019.01)
*G01R 31/374*   (2019.01)
(Continued)

(52) U.S. Cl.
CPC ....... *G01R 31/3835* (2019.01); *G01R 31/374* (2019.01); *G01R 31/54* (2020.01);
(Continued)

(58) Field of Classification Search
None
See application file for complete search history.

(56) References Cited

U.S. PATENT DOCUMENTS

| 5,869,950 A | 2/1999 | Hoffman, Jr. et al. |
| 6,255,803 B1 | 7/2001 | Ishihara et al. |
| (Continued) | | |

FOREIGN PATENT DOCUMENTS

| CN | 106707180 A | 5/2017 |
| CN | 107431370 A | 12/2017 |
| (Continued) | | |

OTHER PUBLICATIONS

Extended European Search Report including Written Opinion for Application No. 20881548.0 dated Aug. 2, 2022, pp. 1-8.
(Continued)

*Primary Examiner* — Raymond L Nimox
(74) *Attorney, Agent, or Firm* — Lerner David LLP

(57) ABSTRACT

An apparatus and method for diagnosing a battery bank having a failure in a connection state, including a state measuring unit configured to measure a state of each battery bank of a battery pack during a charging process and a discharging process of the battery pack; and a control unit configured to extract at least one battery bank by comparing states of the battery banks measured during the charging process of the battery pack with each other, extract at least one battery bank by comparing states of the battery banks measured during the discharging process of the battery pack with each other, and distinguish a battery bank having a failure in a connection state based on whether the battery banks respectively extracted during the charging process and the discharging process are identical to each other.

13 Claims, 7 Drawing Sheets

(51) Int. Cl.
  *G01R 31/54* (2020.01)
  *H01M 10/42* (2006.01)
  *H01M 10/44* (2006.01)

(52) U.S. Cl.
  CPC ....... *H01M 10/425* (2013.01); *H01M 10/441* (2013.01); *H01M 2010/4271* (2013.01)

(56) References Cited

U.S. PATENT DOCUMENTS

| | | |
|---|---|---|
| 2001/0035737 A1 | 11/2001 | Nakanishi et al. |
| 2004/0001996 A1 | 1/2004 | Sugimoto |
| 2013/0320772 A1* | 12/2013 | Qiao ................ H01M 10/4207 307/85 |
| 2014/0021925 A1 | 1/2014 | Asakura et al. |
| 2016/0252587 A1 | 9/2016 | Kawanaka |
| 2018/0069417 A1 | 3/2018 | Becker et al. |
| 2019/0187221 A1 | 6/2019 | Mukuno |
| 2019/0198945 A1 | 6/2019 | Machida et al. |
| 2020/0088800 A1* | 3/2020 | Hess .................... G01R 31/389 |
| 2021/0086661 A1 | 3/2021 | Furukawa et al. |

FOREIGN PATENT DOCUMENTS

| | | |
|---|---|---|
| CN | 109642930 A | 4/2019 |
| CN | 110001402 A | 7/2019 |
| JP | H09134742 A | 5/1997 |
| JP | H11285155 A | 10/1999 |
| JP | 2000014031 A | 1/2000 |
| JP | 2000060011 A | 2/2000 |
| JP | 2001116811 A | 4/2001 |
| JP | 2002015781 A | 1/2002 |
| JP | 2004031120 A | 1/2004 |
| JP | 2006185685 A | 7/2006 |
| JP | 2008027658 A | 2/2008 |
| JP | 4945206 B2 | 6/2012 |
| JP | 2016161358 A | 9/2016 |
| JP | 6507989 B2 | 5/2019 |
| JP | 2019095273 A | 6/2019 |
| JP | 2019113455 A | 7/2019 |
| KR | 101865402 B1 | 7/2018 |
| KR | 101889558 B1 | 8/2018 |
| WO | 2018051885 A1 | 3/2018 |
| WO | 2019123907 A1 | 6/2019 |

OTHER PUBLICATIONS

International Search Report for PCT/KR2020/012050 dated Dec. 21, 2020. 4 pgs.

* cited by examiner

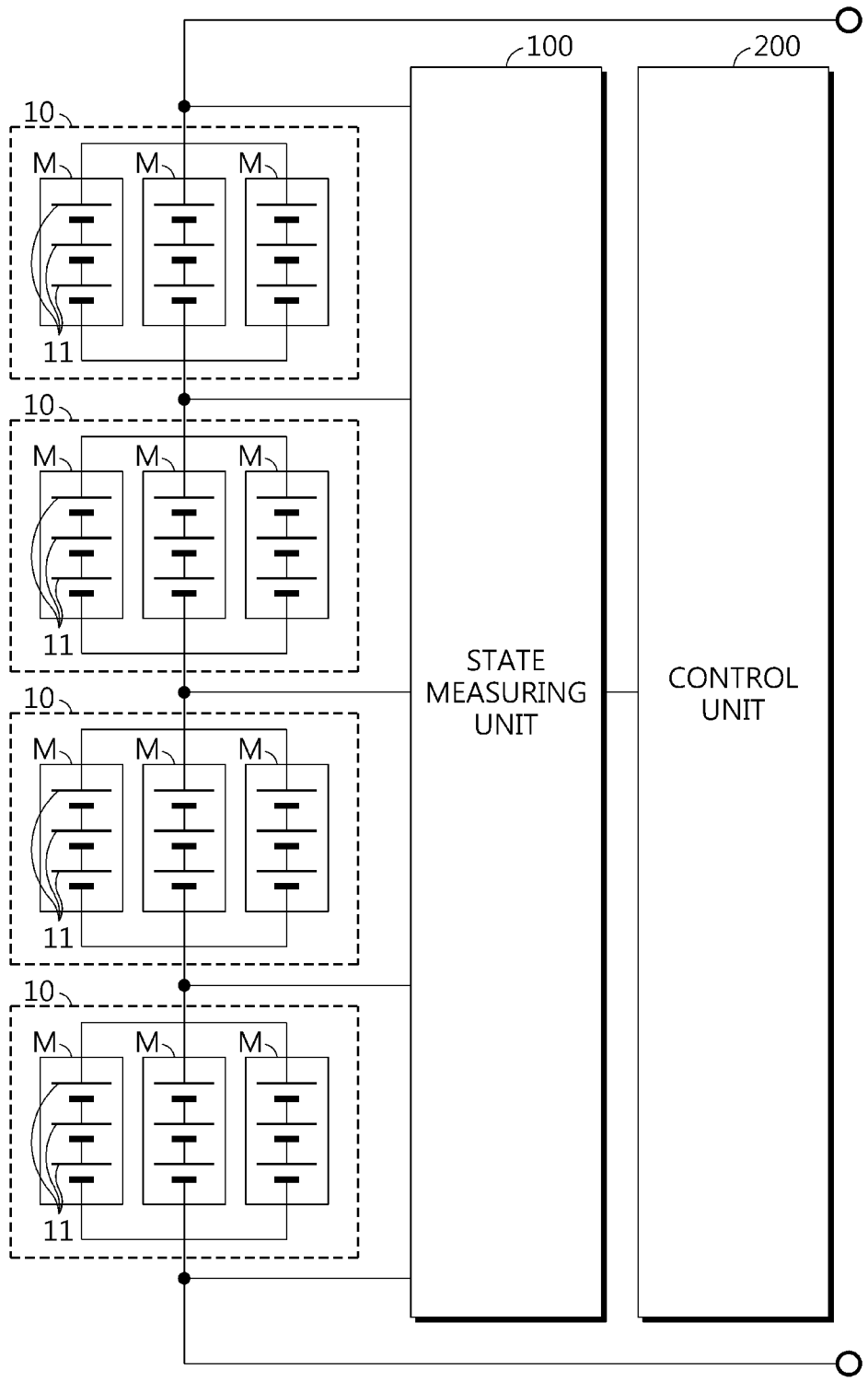

BATTERY DIAGNOSING APPARATUS AND METHOD

CROSS-REFERENCE TO RELATED APPLICATIONS

The present application is a national phase entry under 35 U.S.C. § 371 of International Application No. PCT/KR2020/012050 filed Sep. 7, 2020, published in Korean, which claims priority from Korean Patent Application No. 10-2019-0134819 filed Oct. 28, 2019, all of which are incorporated herein by reference.

TECHNICAL FIELD

The present disclosure relates to a battery diagnosing technology, and more particularly, to a battery diagnosing technology for diagnosing whether a connection state of each battery bank has a problem, in a battery pack or a battery system including a plurality of battery banks.

BACKGROUND ART

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

The lithium secondary battery mainly uses lithium-based oxide and carbon material as positive electrode active material and negative electrode active material, respectively. The lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

Recently, secondary batteries are widely used not only for small-sized devices such as portable electronic devices, but also for medium-sized and large-sized devices such as vehicles or energy storage systems (ESS) for driving or energy storage. The secondary battery is provided in a battery pack and mounted to a medium-sized or large-sized device. At this time, a large number of secondary batteries are included in the battery pack and electrically connected to each other in order to increase the capacity and output of the battery pack.

In particular, a plurality of secondary batteries may be connected in parallel to form one battery bank, and a plurality of battery banks may be connected in series to form one battery pack.

However, while the battery pack is being used, the parallel connection of some secondary batteries included in each battery bank may be disconnected. For example, in each battery bank, a plurality of battery cells may be connected in parallel with each other through a bus bar or switch. At this time, due to the separation of the junction between the bus bar and the electrode lead, the break of the bus bar or the breakdown of the switch, some battery cells may not be connected in parallel with other battery cells but maintained in a separated state, which results in an open failure.

If the battery pack is continuously used in a state where the open failure of some battery cells is not properly diagnosed, current may be concentrated to other normal battery cells in which the open failure does not occur, in the corresponding battery bank. In this case, at the battery cell in which the current is concentrated, a current larger than an intended level flows, which may cause problems such as damage or accelerated deterioration.

SUMMARY

Technical Problem

The present disclosure is designed to solve the problems of the related art, and therefore the present disclosure is directed to providing a battery diagnosing apparatus, which may quickly and accurately diagnose a battery bank having a failure in a connection state among a plurality of battery banks included in a battery pack, a battery pack including the battery diagnosing apparatus, and so on.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery diagnosing apparatus for diagnosing a connection state of a battery pack that includes a plurality of battery banks each battery bank including a respective plurality of battery modules connected in parallel to one another, each battery module including one or more battery cells, the battery diagnosing apparatus comprising: a state measuring unit configured to measure a state of each battery bank during each of a charging process and a discharging process of the battery pack; and a control unit configured to: select a first battery bank based on a comparison of states of the battery banks measured during the charging process of the battery pack with each other, select a second battery bank based on a comparison of states of the battery banks measured during the discharging process of the battery pack with each other, and determine a failure in a connection state of at least one battery bank of the plurality of battery banks based on the first and second selected battery banks being identical to each other.

Here, the state measuring unit may be configured to measure a voltage of each battery bank, and the control unit may be configured to select the first battery bank based on a respective voltage value of each battery bank measured at a first time point during the charging process of the battery pack, and select the second battery bank based on a respective voltage value of each battery bank measured at a second time point during the discharging process of the battery pack.

In addition, the control unit may be configured to: select the first battery bank in response to the first battery bank having a greatest voltage value among the plurality of battery banks at the first time point, and select the second battery bank in response to the second battery bank having a smallest voltage value among the plurality of battery banks at the second time point.

In addition, the control unit may be configured to: determine that the at least one battery bank has a failure in response to: a difference between: (i) the voltage value at the first time point of the first selected battery bank; and (ii) a voltage value at the first time point of a different battery bank of the plurality of battery banks being greater than or equal to a first reference value; and a difference between (i) the voltage value at the second time point of the second selected battery bank; and (ii) a voltage value at the second time point of a different battery bank of the plurality of battery banks being greater than or equal to a second reference value.

In addition, the control unit may be configured to: compare a difference between the voltage value of the first selected battery bank to a voltage value of a next-rank battery bank at the first time point with the first reference value; and compare a difference between the voltage value of the second selected battery bank to a voltage value of a next-rank battery bank at the second time point with the second reference value.

In addition, the control unit may be configured to determine failure of the at least one battery bank based on a state of each battery bank of the plurality of battery banks during a process other than the charging process and the discharging process, in response to: a difference between the voltage value at the first time point of the first selected battery bank and a voltage value at the first time point of a different battery bank being smaller than the first reference value; or a difference between the voltage value at the second time point of the second selected battery bank and a voltage value at the second time point of a different battery bank being smaller than the second reference value.

In addition, the charging situation may switch to the discharging process at the first time point and the discharging processes may switch to the charging process at the second time point.

In addition, the connection state of the at least one battery bank may be an open state.

In addition, the control unit may be configured to distinguish a battery bank that includes a battery cell having a failure in open state.

In addition, the state measuring unit may be configured to measure a temperature of each battery bank, and the control unit may be configured to: select the first battery bank based on a comparison of the temperatures of the plurality of battery banks measured during the charging process of the battery pack with each other; and select the second battery bank based on a comparison of the temperatures of the plurality of battery banks measured during the discharging process of the battery pack with each other.

In addition, the control unit may be configured to compare state change rates of the plurality of battery banks during the charging process and the discharging process of the battery pack with each other; and determine the failure in the connection state of the at least one battery bank based on the at least one battery bank having a highest state change rate during both the charging process and the discharging process.

In addition, the battery diagnosing apparatus further comprises an alarm unit, wherein the control unit is configured to control the alarm unit to notify the failure based on the first and second selected battery banks being identical to each other.

In addition, in another aspect of the present disclosure, there is also provided a battery pack, comprising a battery diagnosing apparatus according to any of the embodiments described in the present disclosure.

In addition, in another aspect of the present disclosure, there is also provided a battery diagnosing apparatus for diagnosing a connection state of a battery pack that includes a plurality of battery banks respectively having a plurality of battery modules connected in parallel, the battery diagnosing apparatus comprising: a state measuring unit configured to measure a state of each battery bank during a charging process and a discharging process of the battery pack; and a control unit configured to extract at least one battery bank by comparing states of the battery banks measured during the charging process of the battery pack with each other, extract at least one battery bank by comparing states of the battery banks measured during the discharging process of the battery pack with each other, and distinguish a battery bank having a failure in a connection state based on whether the battery banks respectively extracted during the charging process and the discharging process are identical to each other.

In addition, in another aspect of the present disclosure, there is also provided a battery diagnosing apparatus for diagnosing a connection state of a battery system that includes a plurality of battery banks, each battery bank including a respective plurality of battery packs connected in parallel to one another, the battery diagnosing apparatus comprising: a state measuring unit configured to measure a state of each battery bank during each of a charging process and a discharging process of the battery system; and a control unit configured to select a first battery bank based on a comparison of states of the battery banks measured during the charging process of the battery system with each other, select a second battery bank based on a comparison of states of the battery banks measured during the discharging process of the battery system with each other, and determine a failure in a connection state of at least one battery bank of the plurality of battery banks based on the first and second selected battery banks being identical to each other.

In addition, in another aspect of the present disclosure, there is also provided a battery diagnosing method for diagnosing a connection state of a battery pack that includes a plurality of battery banks, each battery bank including a plurality of respective battery cells connected in parallel to one another, the battery diagnosing method comprising: measuring a state of each battery bank during each of a charging process and a discharging process of the battery pack; selecting, by a control unit, a first battery bank by comparing states of the battery banks measured during the charging process of the battery pack with each other; selecting, by the control unit, a second battery bank by comparing states of the battery banks measured during the discharging process of the battery pack with each other; determining, by the control unit, whether the first and second battery banks are identical to each other; and determining, by the control unit, a failure in a connection state of at least one battery bank of the plurality of battery banks based on the first and second battery banks being identical to each other.

Advantageous Effects

According to the present disclosure, in a battery pack including a plurality of battery banks electrically connected to each other, a battery bank having a problem in a connection state may be effectively diagnosed.

In particular, according to an embodiment of the present disclosure, in a battery pack configuration in which a plurality of battery banks respectively including a plurality of battery cells connected in parallel are connected in series, a battery bank in which a parallel connection of some battery cells is disconnected may be quickly and accurately identified.

Therefore, according to this embodiment of the present disclosure, damage or degradation of normal battery cells included in the battery bank having an open failure may be prevented.

Moreover, according to an embodiment of the present disclosure, even if charging and discharging are repeatedly performed before reaching a full charge or full discharge state, it is possible to quickly and accurately diagnose whether there is a battery bank in which an open failure occurs.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 10 is a diagram schematically showing a battery diagnosing apparatus according to another embodiment of the present disclosure.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
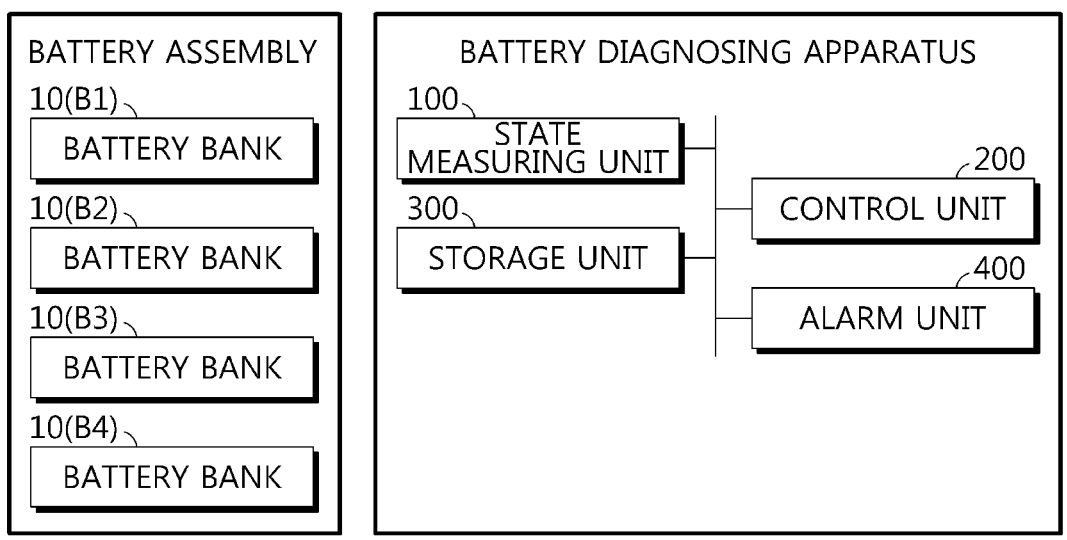
FIG. 1 is a block diagram schematically showing a functional configuration of a battery diagnosing apparatus according to an embodiment of the present disclosure.

FIG. 1 is a block diagram schematically showing a functional configuration of a battery diagnosing apparatus according to an embodiment of the present disclosure.

As shown in FIG. 1, a battery pack may include a plurality of battery banks 10. In FIG. 1, only four battery banks 10 are shown, but the present disclosure is not necessarily limited by the specific number of battery banks 10. The battery banks 10 may be electrically connected to each other to form a battery assembly. In particular, the plurality of battery banks 10 may be connected in series with each other inside the battery pack. In addition, each battery bank 10 may include a plurality of battery cells, namely a plurality of secondary batteries, connected in parallel to each other. In addition, the number of battery cells connected in parallel in each battery bank 10 may be the same. That is, the battery banks 10 included in the battery pack may be configured to have the same performance or specifications. A battery diagnosing apparatus according to the present disclosure may diagnose a connection state of the battery pack that includes a plurality of battery banks 10 respectively having a plurality of battery cells connected in parallel.

Referring to FIG. 1, the battery diagnosing apparatus according to the present disclosure may include a state measuring unit 100 and a control unit 200.

The state measuring unit 100 may measure a state for each of the plurality of battery banks 10 included in the battery pack. In particular, the state measuring unit 100 may measure the state of each battery bank 10 during a charging process and a discharging process of the battery pack, respectively. That is, the state measuring unit 100 may measure the state of each battery bank 10 during a charging process of the battery pack and also measure the state of each battery bank 10 during a discharging process of the battery pack. In addition, the state measuring unit 100 may transmit the measured state of each battery bank 10 to the control unit 200.

Here, the state of the battery bank 10 may include at least one of a voltage at both ends of the battery bank 10, a current flowing in the battery bank 10, a temperature of the battery bank 10, SOC (State Of Charge) of the battery bank 10, and SOH (State Of Health) of the battery bank 10. That is, the state measuring unit 100 may measure at least one of voltage, current, temperature, SOC and SOH of each battery bank 10 during each of the charging process and the discharging process of the battery pack.

The state measuring unit 100 may employ various state measurement and data transmission techniques known at the filing date of this application in order to measure and transmit the state of each of the plurality of battery banks 10. For example, the state measuring unit 100 may be implemented using various voltage sensors, current sensors and/or temperature sensors known at the filing date of this application.

The control unit 200 may extract at least one battery bank 10 by comparing the state of each battery bank 10 measured by the state measuring unit 100 during the charging process of the battery pack. In addition, the control unit 200 may extract at least one battery bank 10 by comparing the state of each battery bank 10 measured by the state measuring unit 100 during the discharging process of the battery pack. That is, the control unit 200 may select some battery banks 10 based on the state information measured for several battery banks 10 during each of the charging process and the discharging process of the battery pack. For example, the control unit 200 may select one battery bank 10 based on state information such as voltage or temperature of each battery bank 10 measured during the charging process of the battery pack. In addition, the control unit 200 may select one battery bank 10 based on state information such as voltage or temperature of each battery bank 10 measured during the discharging process of the battery pack.

Here, when the control unit 200 extracts each battery bank 10 during the charging process and the discharging process, the bank extraction result in another process may not have an effect. For example, the control unit 200 may not consider the state measurement result measured during the discharging process when extracting one battery bank 10 based on the state measurement result measured during the charging process. In addition, the control unit 200 may not consider the state measurement result measured during the charging process when extracting one battery bank 10 based on the state measurement result measured during the discharging process. That is, the processes of extracting a specific bank during the charging process and the discharging process by the control unit 200 may be not dependent on each other but may be independent from each other.

In addition, the control unit 200 may determine whether the battery banks 10 respectively extracted during the charging process and the discharging process are identical to each other. That is, the control unit 200 may identify the battery bank 10 extracted during the charging process of the battery pack and the battery bank 10 extracted during the discharging process of the battery pack, respectively, and compare whether the identified battery banks 10 are identical to each other. In addition, the control unit 200 may distinguish a battery bank 10 having a failure based on whether the battery banks 10 respectively extracted during the charging process and the discharging process are identical to each other. That is, if the battery bank 10 extracted during the charging process and the battery bank 10 extracted during the discharging process are identical to each other, the control unit 200 may determine that the corresponding battery bank 10 has a failure.

For example, as in the embodiment shown in FIG. 1, in a configuration where four battery banks 10, namely a first bank B1, a second bank B2, a third bank B3 and a fourth bank B4, are included in the battery assembly, if the battery bank 10 extracted during the charging process of the battery pack is the second bank B2 and the battery bank 10 extracted during the discharging process of the battery pack is the second bank B2, it may be regarded that the battery banks 10 respectively extracted during the charging process and the discharging process are identical to each other. In this case, the control unit 200 may determine that the second bank B2 has a failure.

In particular, the control unit 200 may determine that the battery bank 10 has a failure in a connection state according to whether the battery banks 10 respectively extracted during the charging process and the discharging process are identical to each other. For example, if the second bank B2 is extracted identically during the charging process and the discharging process as in the embodiment among four battery banks 10, it may be determined that the second bank B2 has a failure in its internal connection state.

According to this configuration of the present disclosure, it is possible to simply and quickly identify the battery bank 10 having a failure in the connection state. Moreover, if it is determined that a specific battery bank 10 has a problem, the control unit 200 may perform an appropriate subsequent operation. For example, the control unit 200 may turn off a charging or discharging path by controlling a switch provided on the charging and discharging path of the battery pack, or may notify an external user of the failure. Accordingly, it is possible to prevent a problem caused by continuously using the battery bank 10 having a failure in the internal connection state, for example a problem that a normal battery cell in the corresponding battery bank 10 is damaged or degraded.

Meanwhile, the control unit 200 may optionally include processor, application-specific integrated circuits (ASIC), other chipsets, logic circuits, registers, communication modems, data processing devices, or the like, known in the art, to execute various control logics performed in the present disclosure. In addition, when a control logic is implemented in software, the control unit 200 may be implemented as a set of program modules. In this case, the program module may be stored in a memory and executed by a processor. The memory may be provided inside or outside the processor, and may be connected to the processor through various well-known means. Moreover, the battery pack often includes a control unit that is referred to as a microcontroller unit (MCU) or a battery management system (BMS). The control unit 200 may be implemented by components such as the MCU or the BMS provided in a conventional battery pack.

Preferably, the control unit 200 may identify the battery bank 10 having a failure according to voltage information measured as the state of the battery bank 10.

Figure 2:
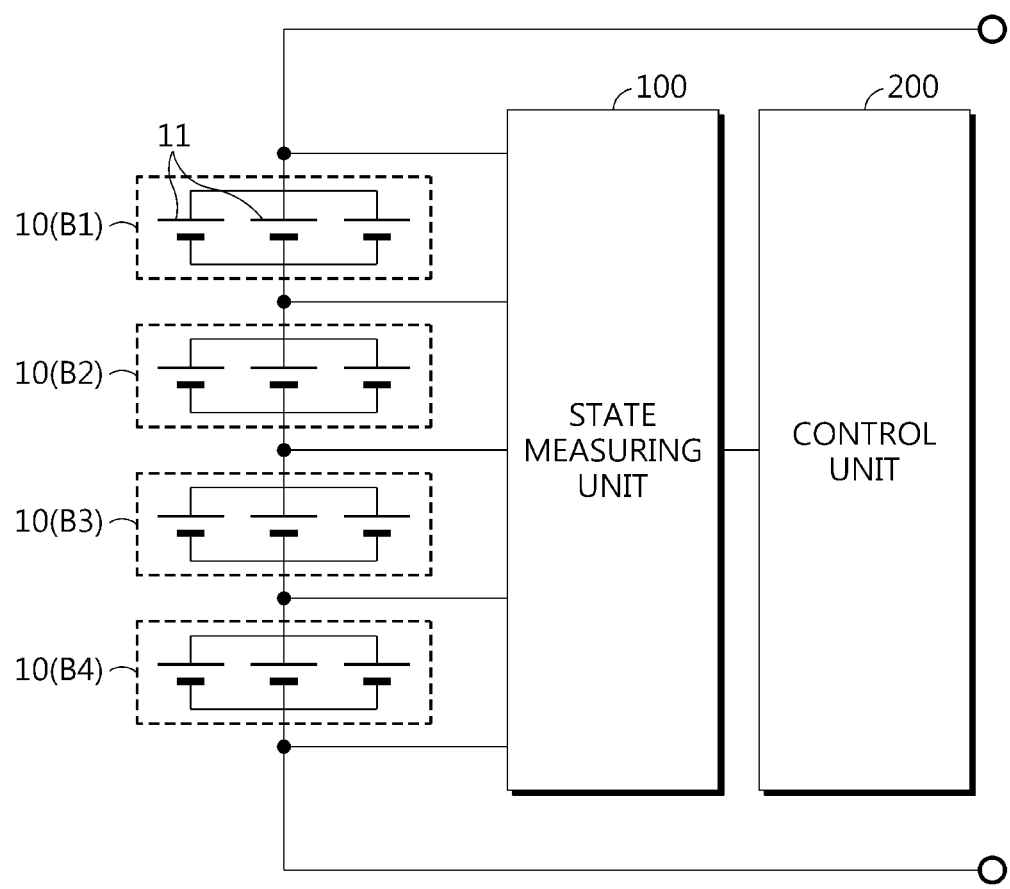
FIG. 2 is a diagram schematically showing a connection configuration of a battery pack including the battery diagnosing apparatus according to an embodiment of the present disclosure.

FIG. 2 is a diagram schematically showing a connection configuration of a battery pack including the battery diagnosing apparatus according to an embodiment of the present disclosure.

Referring to FIG. 2, the battery pack includes a plurality of battery banks 10, namely a first bank B1, a second bank B2, a third bank B3 and a fourth bank B4, and the battery banks 10 may be connected to each other in series. In addition, each battery bank 10 may be configured such that a plurality of battery cells 11 included therein are connected in parallel with each other. However, in FIG. 2, for convenience of description, it is depicted that three battery cells 11 are connected in parallel in each battery bank 10, but this is just an example, and the present disclosure is not limited by the number of battery cells 11 connected in parallel inside the battery bank 10.

Preferably, the state measuring unit 100 may be connected to both ends of each battery bank 10 and configured to measure a voltage at both ends of each battery bank 10. In this case, the state measuring unit 100 may be referred to as a voltage measuring unit. That is, the state measuring unit 100 may measure the voltage at both ends of each of the first bank B1, the second bank B2, the third bank B3 and the fourth bank B4. In addition, the information measured by the state measuring unit 100 as above may be transmitted to the control unit 200.

At this time, the control unit 200 may each extract one battery bank 10 by using the voltage value of the battery bank 10 measured at a specific time point during the charging process and the discharging process. This will be described in more detail with reference to FIGS. 3 to 5.

Figure 3:
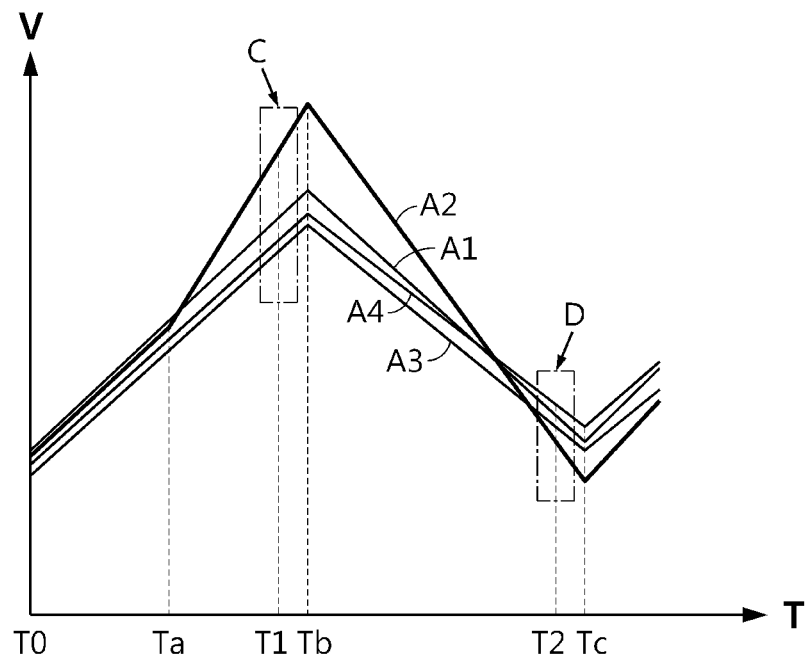
FIG. 3 is a graph schematically showing an example of a voltage measurement result measured by a state measuring unit of the battery diagnosing apparatus according to an embodiment of the present disclosure.
Figure 4:
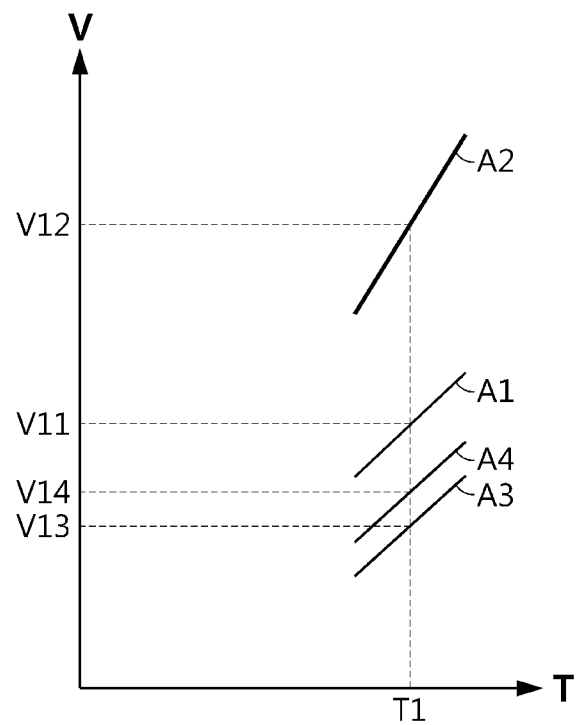
FIG. 4 is a graph showing a portion C of FIG. 3 in an enlarged form.
Figure 5:
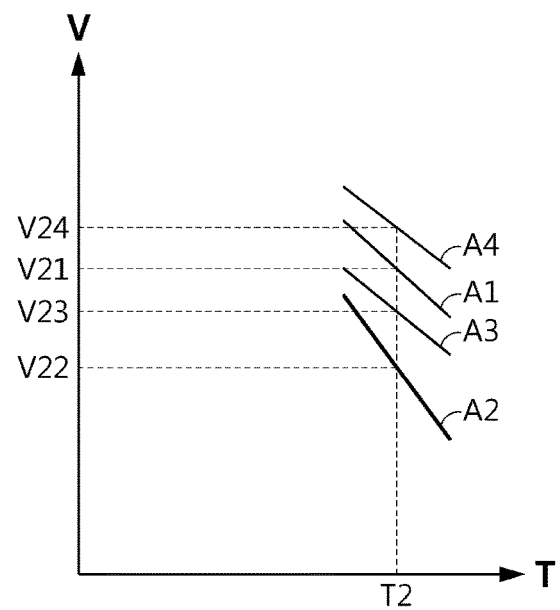
FIG. 5 is a graph showing a portion D of FIG. 3 in an enlarged form.

FIG. 3 is a graph schematically showing an example of a voltage measurement result measured by the state measuring unit 100 of the battery diagnosing apparatus according to an embodiment of the present disclosure. Also, FIG. 4 is a graph showing a portion C of FIG. 3 in an enlarged form, and FIG. 5 is a graph showing a portion D of FIG. 3 in an enlarged form. In FIGS. 3 to 5, A1 to A4 may represent voltage measurement results of the first to fourth banks B1 to B4, respectively. In addition, in FIGS. 3 to 5, the x-axis may represent time and the y-axis may represent voltage.

In FIG. 3, based on the x-axis that is a time axis, the battery pack may be charged in the section between T0 and Tb, and the battery pack may be discharged in the section between Tb and Tc. In particular, in the embodiment of FIG. 3, it is depicted that the voltage of the second bank B2 measured at the Ta time point is different from the previous measurement pattern or from the voltage pattern of other battery banks 10. This embodiment may be set on the assumption that the second bank B2 has a failure in the internal connection state at the Ta time point.

Here, the control unit 200 may extract one battery bank 10 by using the voltage value of each battery bank 10 (B1 to B4) measured at any one time point during the charging process of the battery pack. Here, one time point at which the voltage value is measured to extract a specific battery bank 10 is a first time point, and may be an arbitrary time point during the charging process of the battery pack. For example, in the embodiment of FIGS. 3 and 4, the first time point, which is a specific time point during the charging processes of the battery pack, is a time point indicated by T1. The first time point T1 may be a time point between the time points T0 and Tb, which is a first charging section in the embodiment of FIG. 3. The first time point T1 may be selected in various ways, and for example, may be selected by the control unit 200 or set in advance by a user.

Meanwhile, in FIG. 4, the voltage values of the first bank B1, the second bank B2, the third bank B3 and the fourth bank B4 measured at the first time point T1 are V11, V12, V13 and V14, respectively. The control unit 200 may extract any one battery bank 10 based on the voltage values V11 to V14 of the first to fourth banks B1 to B4 at the time point T1 in this way. That is, the control unit 200 may select any one battery bank 10 among the first to fourth banks based on the voltage values V11, V12, V13 and V14 of the first to fourth banks.

In addition, the control unit 200 may extract one battery bank 10 by using the voltage value of each battery bank 10 measured at any one time point during the discharging process of the battery pack. Here, one time point at which the voltage value is measured to extract the battery bank 10 is a second time point, and may be an arbitrary time point during the discharging process of the battery pack. For example, in the embodiment of FIGS. 3 and 5, the second time point, which is a specific time point during the discharging processes of the battery pack, is a time point indicated by T2. The second time point T2 may be one time point between the time points Tb and Tc, which is a first discharging section in the embodiment of FIG. 3. The second time point T2 may be determined in various ways, and for example, may be selected by the control unit 200 or set in advance by a user.

Meanwhile, in FIG. 5, the voltage values of the first bank B1, the second bank B2, the third bank B3 and the fourth bank B4 measured at the second time point T2 are V21, V22, V23 and V24, respectively. The control unit 200 may extract any one battery bank 10 based on the voltage values V21 to V24 of the first to fourth banks B1 to B4 at the time point T2 in this way. That is, the control unit 200 may select any one battery bank 10 among the first to fourth banks based on the voltage values V21, V22, V23 and V24 of the first to fourth banks.

If one battery bank 10 is extracted at each of the first time point T1 and the second time point T2 as described above, the control unit 200 may determine whether the battery banks 10 respectively extracted as above are identical to each other. In addition, if the extracted battery banks 10 are identical to each other as above, the control unit 200 may determine that the corresponding battery bank 10 has a failure in the connection state. For example, if the battery bank 10 extracted at the first time point T1 is the first bank B1 and the battery bank 10 extracted at the second time point T2 is also the first bank B1, it may be regarded that the battery banks 10 respectively extracted at the first time point T1 and the second time point T2 are identical to each other. In this case, the control unit 200 may determine that the first bank B1 has a failure in the connection state. Meanwhile, if the battery bank 10 extracted at the first time point T1 is the first bank B1 and the battery bank 10 extracted at the second time point T2 is the second bank B2, it may be regarded that the battery banks 10 respectively extracted at the first time point T1 and the second time point T2 are different. In this case, the control unit 200 may determine that any battery bank 10 does not have a failure in the connection state among the first to fourth banks.

According to this embodiment of the present disclosure, it possible to find a specific battery bank 10 having a failure more simply and quickly. In addition, in this case, it is easy to determine which battery bank 10 has a failure. In particular, in this embodiment, it is possible to identify whether any battery bank 10 has a failure and which battery bank 10 has a failure, just by two voltage measurements, namely one voltage measurement at each of the charging time point and the discharge time point.

Preferably, the control unit 200 may extract a battery bank 10 having a greatest voltage value or a smallest voltage value at each time point. In particular, the control unit 200 may extract a battery bank 10 having a greatest voltage value during the charging process of the battery pack and extract a battery bank 10 having a smallest voltage value during the discharging process of the battery pack.

For example, in the configuration of FIGS. 3 and 4, the control unit 200 may distinguish which battery bank 10 has a greatest voltage value among the four voltage values V11, V12, V13, V14 measured at the first time point T1 during the charging process. More specifically, the greatest voltage value measured at the time point T1 is V12. In addition, the battery bank 10 having the voltage value V12 is the second bank B2. Therefore, the control unit 200 may extract the second bank B2 as the battery bank 10 having a greatest voltage value at the time point T1 during the charging process.

In addition, in the configuration of FIGS. 3 and 5, the control unit 200 distinguish which battery bank 10 has a smallest voltage value among the four voltage values V21, V22, V23, V24 measured at the second time point T2 during the discharging process. More specifically, the smallest voltage value measured at the time point T2 is V22. In addition, the battery bank 10 having the voltage value V22 is the second bank B2. Therefore, the control unit 200 may extract the second bank B2 as the battery bank 10 having the smallest voltage value at the time point T2 during the discharging process.

In this way, if the battery banks 10 extracted at the first time point T1 and the second time point T2 are identical as the second bank B2, the control unit 200 may determine that the extracted battery bank 10, namely the second bank B2, has a failure in the connection state.

According to this configuration of the present disclosure, it is possible to easily identify whether any battery bank 10 has a connection failure and which battery bank 10 has a connection failure, by identifying only the battery bank 10 having a greatest voltage value or a smallest voltage value among the voltage values measured at the first time point T1 and the second time point T2.

Moreover, the control unit 200 may determine whether the battery bank 10 has a final failure in consideration of a voltage difference between the battery bank 10 extracted at the first time point T1 and the second time point T2 and another battery bank 10. Here, the voltage difference may be considered as an absolute value of the voltage difference between the battery bank 10 extracted at each time point and a battery bank 10 not extracted.

First, the control unit 200 may compares the voltage value at the first time point T1 of the battery bank 10 extracted at the first time point T1 with a voltage value at the first time point T1 of another battery bank 10 to compare whether the difference between them is greater than or equal to a first reference value. For example, as in the embodiment of FIG. 4, if the battery bank 10 extracted at the first time point T1 is the second bank B2, the control unit 200 may compare whether the difference between the measured voltage value V12 of the second bank B2 at the first time point T1 and the voltage values V11, V13, V14 of the battery banks B1, B3, B4 other than the second bank B2 is greater than or equal to the first reference value. Here, the first reference value may be determined in advance by the control unit 200 or the user. The first reference value may be determined in advance in consideration of various factors such as specifications of the battery pack or a use environment of the battery pack. For example, the first reference value may be 0.05V.

In addition, the control unit 200 may compare the voltage value at the second time point T2 of the battery bank 10 extracted at the second time point T2 with the voltage value at the second time point T2 of another battery bank 10 to compare whether the difference between them is greater than or equal to a second reference value. For example, as in the embodiment of FIG. 5, if the battery bank 10 extracted at the second time point T2 is the second bank B2, the control unit 200 may compare whether the difference between the measured voltage value V22 of the second bank B2 at the second time point T2 and the voltage values V21, V23, V24 of the battery banks B1, B3, B4 other than the second bank B2 is greater than or equal to the second reference value. Here, like the first reference value, the second reference value may be predetermined by the control unit 200 or the user. The second reference value may be identical to or different from the first reference value, and may be determined in advance in consideration of various factors such as specifications of the battery pack or the use environment of the battery pack. For example, the second reference value may be 0.05V.

In this configuration, if the difference between the voltage value at the first time point T1 of the battery bank 10 extracted at the first time point T1 and the voltage value at the first time point T1 of another battery bank 10 is greater than or equal to the first reference value and the difference between the voltage value at the second time point T2 of the battery bank 10 extracted at the second time point T2 and the voltage value at the second time point T2 of another battery bank 10 is greater than or equal to the second reference value, the control unit 200 may finally determine that the extracted battery bank 10 has a failure.

For example, in the embodiment of FIGS. 4 and 5, both the battery banks 10 respectively extracted at the first time point T1 and the second time point T2 are the second bank B2, the voltage values at the first time point T1 and the second time point T2 are respectively V12 and V22, and the first reference value and the second reference value are 0.05V, the control unit 200 may determine that the second bank B2 has a connection failure only when the difference between the voltage value V12 and the voltage values V11, V13, V14 of other battery banks B1, B3, B4 at the first time point T1 is greater than or equal to 0.05V and the difference between the voltage value V22 and the voltage values V21, V23, V24 of other battery banks B1, B3, B4 at the second time point T2 is greater than or equal to 0.05V. Meanwhile, even though the battery bank 10 extracted at the first time point T1 and the battery bank 10 extracted from the second time point T2 are identical to each other, if the voltage difference at the first time point T1 does not reach the first reference value or the voltage difference at the second time point T2 does not reach the second reference value, it may be finally determined that the extracted battery bank 10 does not have a failure in the connection state. That is, if the difference between the voltage values at the first time point T1 is greater than or equal to the first reference value but the difference between the voltage values at the second time point T2 is smaller than the second reference value, or if the difference between the voltage values at the second time point T2 is greater than or equal to the second reference value but the difference between the voltage value at the first time point T1 is smaller than the first reference value, or if the difference between the voltage value at the first time point T1 and the difference between the voltage value at the second time point T2 are respectively smaller than the first reference value and the second reference value, it may be determined that the extracted battery bank 10 does not have a failure.

According to this configuration of the present disclosure, even though the voltage value at the first time point T1 during the charging process is measured highest and the voltage value at the second time point T2 during the discharging process is measured lowest, the corresponding battery bank 10 may be determined as having no failure if the voltage difference from other battery banks 10 is not great. For example, even though there is no failure in the connection state, the charging and discharging rate of a specific battery bank 10 may be slightly faster if there is an error in the voltage measurement process or a difference in the degree of degradation between the battery banks 10. However, according to this embodiment, it is possible to prevent the battery bank from being determined as having a connection failure even in this case. Therefore, in this case, the connection failure of the battery bank 10 may be diagnosed with improved reliability and accuracy.

In particular, the control unit 200 may compare the difference between the voltage value of the battery bank 10 extracted at each time point and the voltage value of a next-rank battery bank 10 with a reference value. That is, the control unit 200 may calculate the difference between the voltage value of the battery bank 10 extracted at the first time point and the voltage value of a battery bank 10 measured as having a second highest voltage value, and compare the calculated result value with the first reference value. In addition, the control unit 200 may calculate the difference between the voltage value of the battery bank 10 extracted at the second time point and the voltage value of the battery bank 10 measured as having the second lowest voltage value, and compare the calculated result value with the second reference value.

For example, referring to the embodiment of FIGS. 3 and 4, at the first time point T1, the battery bank 10 having the highest voltage value may be the second bank B2, and the battery bank 10 having the second highest voltage value may be the first bank B1. Therefore, the control unit 200 may obtain the voltage difference between the voltage value V12 of the second bank B2 and the voltage value V11 of the first bank B1 at the first time point T1. In addition, the control unit 200 may compare whether the voltage difference, namely (V12−V11), is greater than or equal to the first reference value. For example, if the first reference value is 0.05V, it is possible to compare whether (V12−V11) is greater than or equal to 0.05V.

In addition, referring to the embodiment of FIGS. 3 and 5, at the second time point T2, the battery bank 10 having a lowest voltage value may be the second bank B2, and the battery bank 10 having a second lowest voltage value may be the third bank B3. Therefore, the control unit 200 may obtain the voltage difference between the voltage value V22 of the second bank B2 and the voltage value V23 of the third bank B3 at the second time point T2. In addition, the control unit 200 may compare whether an absolute value of the voltage difference, namely (V22−V23), is greater than or equal to the second reference value. For example, if the second reference value is 0.05V, it is possible to compare whether the absolute value of (V22−V23) is greater than or equal to 0.05V.

In this embodiment, the control unit 200 may determine that the corresponding battery bank 10 has a failure only when the voltage difference at the first time point T1 is greater than or equal to the first reference value and the voltage difference at the second time point T2 is greater than or equal to the second reference value. For example, in this embodiment, if both the condition that (V12−V11) is greater than or equal to 0.05V and the condition that the absolute value of (V22−V23) is greater than or equal to 0.05V are satisfied, the control unit 200 may finally determine that the second bank B2 has a connection failure.

According to this configuration of the present disclosure, in considering the voltage difference between the battery banks 10, only the voltage difference between two measured values in each process need to be compared, and other measured values may not be considered. In other words, it is needed to compare the difference between two voltage values measured highest in the charging process and compare the difference between two voltage values measured lowest in the discharging process, and other measured values may not be considered. Therefore, in determining a connection failure of a specific battery bank 10, errors or mistakes may be eliminated or reduced through a relatively simple process. In particular, if a large number of battery cells 11 are connected in parallel in one battery bank 10, it is needed to consider only first-rank and second-rank voltage differences in an ascending or descending order, without considering the voltage differences between all battery cells 11. Therefore, the determination time and resource consumption of the control unit 200 may be reduced.

As another example, the control unit 200 may compare the difference between the voltage value of a specific battery bank 10 extracted at each time point and an average voltage value of other battery banks 10 with a reference value. That is, the control unit 200 may compare the voltage value at the first time point T1 of the battery bank 10 extracted at the first time point with the average value of the voltage values at the first time point T1 of other battery banks 10, and compare the voltage difference between them with the first reference value. In addition, the control unit 200 may compare the voltage value at the second time point T2 of the battery bank 10 extracted at the second time point T2 with the average value of the voltage values at the second time point T2 of other battery banks 10, and compare the voltage difference between them with the second reference value.

For example, in the embodiment where the second bank B2 is extracted, the control unit 200 may obtain an average value V1a at the first time point T1 of battery banks B1, B3, B4 other than the second bank B2 as follows.

$$V1a=(V11+V13+V14)/3$$

In addition, the control unit 200 may compare the average value V1a at the first time point T1 obtained as above with the voltage value V12 at the first time point T1 of the second bank B2.

Next, the control unit 200 may compare whether (V12−V1a) is greater than or equal to the first reference value.

In addition, the control unit 200 may obtain an average value V2a at the second time point T2 of battery banks B1, B3, B4 other than the second bank B2 as follows.

$$V2a=(V21+V23+V24)/3$$

In addition, the control unit 200 may compare the average value V2a at the second time point T2 obtained as above with the voltage value V22 at the second time point T2 of the second bank B2.

Next, the control unit 200 may compare whether the absolute value of (V22−V2a) is greater than or equal to the second reference value.

In addition, the control unit 200 may determine that the second bank has a connection failure only when (V12−V1a) is greater than or equal to the first reference value and the absolute value of (V22−V2a) is greater than or equal to the second reference value.

According to this configuration of the present disclosure, accuracy and reliability may be further improved in determining a connection failure of the battery bank 10. For example, even though two or more battery cells 11 have a connection failure in a specific battery bank 10 or an error occurs in measuring a voltage of the next-rank battery cell 11, according to this embodiment, it is possible to more accurately detect a connection failure of the specific battery bank 10 since the measurement values of all battery banks 10 other than the battery bank 10 extracted at each time point are considered.

Meanwhile, if the voltage differences between the battery banks 10 measured at the first time point or the second time point are respectively smaller than the reference values, the control unit 200 may not extract a specific battery bank 10. For example, in the embodiment of FIGS. 3 to 5, if the voltage difference between the highest voltage value V12 and the second highest voltage value V11 measured at the first time point T1 is smaller than the first reference value, the control unit 200 may not extract not only the second bank B2 but also any battery bank 10. Alternatively, if the voltage difference between the lowest voltage value V22 and the second lowest voltage value V23 measured at the second time point T2 is smaller than the second reference value, the control unit 200 may not extract not only the second bank B2 but also any battery bank 10.

In this case, since there is no battery bank 10 extracted at the first time point and/or the second time point, the control unit 200 does not need to determine whether the battery banks 10 extracted at each time point are identical. Therefore, according to this embodiment, unnecessary waste of time and resources of the control unit 200 may be prevented.

In addition, the state measuring unit 100 may further measure a temperature of the battery pack. In this case, the state measuring unit 100 may be referred to as a temperature measuring unit. That is, the state measuring unit 100 may measure the temperature inside and/or outside the battery pack, and transmit the temperature measurement result to the control unit 200. In addition, the control unit 200 may change the first reference value and/or the second reference value according to the temperature of the battery pack measured by the state measuring unit 100.

In particular, if the temperature of the battery pack is out of a predetermined reference temperature range, the control unit 200 may increase the first reference value and the second reference value. For example, in a state where the first reference value and the second reference value are set to 0.05V in a temperature range of 10° C. to 35° C., if the measured temperature of the battery pack is higher than 35° C. or lower than 10° C., the control unit 200 may increase the first reference value and the second reference value to 0.06V.

Moreover, the control unit 200 may change these reference values step by step. For example, if the measured temperature is out of the reference temperature range by less than ±15° C., the control unit 200 may increase the first reference value and second reference value to 0.06V, and if the measured temperature is out of the reference temperature range over ±15° C., the control unit 200 may further increase the first reference value and the second reference value to 0.07V.

According to this configuration of the present disclosure, since the reference value for determining whether a specific battery bank 10 has a failure is adaptively set differently according to temperature, it is possible to more accurately determine whether the battery bank 10 has a failure in consideration of temperature. In particular, the battery cell 11 and the like may have different output voltages or performances depending on temperature, and in this embodiment, a failure of the battery bank 10 may be more accurately determined since the change in characteristics according to temperature is put into consideration.

Moreover, the control unit 200 may be configured to change the reference value in consideration of the temperature of an individual battery bank 10. To this end, the state measuring unit 100 may measure the temperature of different battery banks 10 or the surroundings thereof. For example, if the battery pack includes first to fourth banks B1 to B4, the state measuring unit 100 may be inserted into or attached to each of the first to fourth banks B1 to B4 to measure the temperature of each of the battery banks B1 to B4. In addition, the temperature measurement information of each of the battery banks B1 to B4 measured in this way may be transmitted from the state measuring unit 100 to the control unit 200.

The control unit 200 may change the first reference value and/or the second reference value in consideration of the temperature of the extracted battery bank 10. For example, in the case where the battery banks 10 respectively extracted at the first time point and the second time point are the second bank B2 as in this embodiment, if the temperature of the second bank B2 is within the reference temperature range, namely 10° C. to 35° C., the first reference value and the second reference value may be maintained at 0.05V. However, if the temperature of the second bank B2 is out of the reference temperature range, the control unit 200 may change the first reference value and the second reference value to an increased value, for example 0.06V.

According to this configuration of the present disclosure, it is possible to more clearly diagnose whether the battery bank 10 has a connection failure, considering the fact that there is a deviation in the temperature among the battery banks 10. In particular, a battery bank 10 is located at an inner side in the battery pack may have a relatively higher temperature than a battery bank 10 located at an outer side in the battery pack. In this case, if the battery bank 10 located at an inner side is extracted as the battery bank 10 at the first time point and the second time point, the connection failure of the battery bank 10 may be more accurately diagnosed in consideration of the temperature characteristics according to this location.

In addition, if the difference between the voltage value at the first time point T1 of the battery bank 10 extracted at the first time point T1 and the voltage value at the first time point T1 of another battery bank 10 is smaller than the first reference value or if the difference between the voltage value at the second time point T2 of the battery bank 10 extracted at the second time point T2 and the voltage value at the second time point T2 of another battery bank 10 is smaller than the second reference value, the control unit 200 may be configured to determine whether the extracted battery bank 10 has a failure by further considering the state of each battery bank 10 during a process other than the charging process and the discharging process. In particular, if the difference between the voltage values of the extracted battery bank 10 and another battery bank 10 at the first time point T1 or the second time point T2 is smaller than the first reference value or the second reference value, the control unit 200 may be configured to further examine a voltage behavior of a rest period of the corresponding battery. Here, the rest period may refer to a period in which the battery bank 10 or the battery pack is not charged or discharged and stops not to be used. For example, in the case of a battery pack for a vehicle, a state where the vehicle is turned off may be determined as the rest period of the battery pack.

For example, as in this embodiment, in the case where the battery bank 10 extracted as having the highest voltage value at the first time point T1 and the lowest voltage value at the second time point T2 among the plurality of battery banks 10 is the second bank B2, if the next-rank battery bank 10 at the first time point T1 is the first bank B1, it may be determined whether the voltage difference between the second bank B2 and the first bank B1 is greater than or equal to the first reference value. At this time, if the voltage difference between the second bank B2 and the first bank B1 at the first time point T1 is smaller than the first reference value, the control unit 200 may be configured to further examine not only the charging section and the discharging section but also the voltage behavior of the rest period for the second bank B2.

Alternatively, in this embodiment, if the next-rank battery bank 10 at the second time point T2 is the third bank B3, it may be determined whether the voltage difference between the second bank B2 and the third bank B3 at the second time point T2 is greater than or equal to the second reference value. If the voltage difference between the second bank B2 and the third bank B3 at the second time point T2 is smaller than the second reference value, the control unit 200 may be configured to further examine not only the charging section and the discharging section but also the voltage behavior of the rest period for the second bank B2.

Here, the control unit 200 may be configured to compare the voltage behavior of the rest period of the extracted battery bank 10 with a voltage behavior of a rest period of another battery bank 10. In addition, the control unit 200 may be configured to determine whether the extracted battery bank 10 has a failure by comparing the voltage behaviors of the rest period.

That is, even though the difference between the voltage value of the extracted battery bank 10 at the first time point T1 and/or second time point T2 and the voltage value of another battery bank 10 is not greater than the first reference value and/or the second reference value during charging and discharging of the extracted battery bank 10, the control unit 200 may be configured to determine that the extracted battery bank 10 has a failure if the voltage behaviors of the rest period have a difference over a certain level.

Here, the control unit 200 may be configured to compare the voltage behaviors of the rest period in which the battery pack is not charged or discharged, in various ways.

For example, the control unit 200 may be configured to compare a voltage change amount per predetermined time of each battery bank 10 during the rest period. For example, if the voltage change amount per 0.1 second of the extracted battery bank 10 during the rest period is greater by 0.2V than an average value of voltage change amounts per 0.1 second of other battery banks 10, the control unit 200 may be configured to determine that the extracted battery bank 10 has a failure.

Alternatively, the control unit 200 may be configured to determine whether the battery bank 10 has a failure based on a voltage slope in the voltage graph of each battery bank 10 over time during the rest period.

For example, in the case where the battery bank 10 extracted during the charging process and the discharging process is the second bank B2, if the voltage slope during the rest period of the second bank B2 is greater over a certain level compared to the voltage slope during the rest period of another battery bank 10, the control unit 200 may determine that the second bank B2 has a failure. As a more specific example, the control unit 200 may be configured to compare the voltage slope during the rest period of the second bank B2 extracted in the charging process and the discharging process with other battery banks, and determine that the second bank B2 has a failure if the voltage slope of the second bank B2 is 1.5 times or more of the voltage slope of another battery bank 10.

In other words, during the charging process or the discharging process, even though the state difference, particularly the voltage difference, between the second bank B2 and another battery bank 10 is smaller than the reference value, if the voltage behavior is abnormal during the rest period, the control unit 200 may finally determine that the second bank B2 is the battery bank 10 having a failure.

According to this configuration of the present disclosure, it is possible to more accurately determine whether a specific battery bank 10 has a failure by examining the state of each battery bank 10 not only during the charging process and the discharging process of the battery pack but also during the rest period. In particular, even though the difference between a specific battery bank 10 and another battery bank 10 does not reach the reference value during the charging process and the discharging process, it is possible to more accurately determine the battery bank having a failure by monitoring the corresponding battery bank 10 even for the rest period.

In addition, in this embodiment, if the difference between the voltage value of the extracted battery bank 10 and another voltage value is smaller than the first reference value or the second reference value, the control unit 200 may be configured to examine the battery state of the rest period only when the difference is greater than or equal to a certain level.

For example, if the second bank B2 is extracted at the first time point T1 and the second time point T2 and the difference between the voltage value at the first time point T1 of the second bank B2 and the voltage value at the first time point T1 of another battery bank 10 is smaller than the first reference value, the control unit 200 may determine whether the voltage difference at the first time point T1 is greater than a third reference value. In addition, if the voltage difference at the first time point T1 is greater than the third reference value, the control unit 200 may be configured to compare and determine the rest period state of each battery bank 10, especially the voltage behavior state of each battery bank 10. Meanwhile, if the voltage difference at the first time point T1 is smaller than the third reference value, the control unit 200 may be configured not to compare and determine the rest period state of each battery bank 10. Here, the third reference value may be set in advance as a value smaller than the first reference value. For example, if the first reference value is 0.05V, the third reference value may be set to 0.03V that is smaller than the first reference value. Of course, the third reference value may also be changed according to certain conditions such as temperature.

As another example, if the second bank B2 is identically extracted in the charging process and the discharging process as in the embodiment, if the difference between the voltage value at the second time point T2 of the second bank B2 and the voltage value at the second time point T2 of another battery bank 10 is smaller than the second reference value, the control unit 200 may determine whether the voltage difference at the second time point T2 is greater than a fourth reference value. In addition, if the voltage difference at the second time point T2 is greater than the fourth reference value, the control unit 200 may be configured to compare and determine the rest period state of each battery bank 10, especially the voltage behavior state of each battery bank 10. Meanwhile, if the voltage difference at the second time point T2 is smaller than the fourth reference value, the control unit 200 may be configured not to compare and determine the rest period state of each battery bank 10. Here, the fourth reference value may be set in advance as a value smaller than the second reference value. For example, if the second reference value is 0.05V, the fourth reference value may be set to 0.03V that is smaller than the second reference value. The fourth reference value may also be changed according to certain conditions such as temperature.

In this configuration, it may be regarded that the reference value is provided in multiple stages. According to this configuration of the present disclosure, by examining the rest period state of each battery bank 10 only when certain conditions are satisfied, it is possible to more efficiently determine whether the battery bank 10 has a failure. In particular, according to this embodiment, the rest period state of each battery bank 10 may be determined only when there is a high possibility that a specific battery bank 10 is not determined as having a failure in the first determination process but is determined as having a failure in the second determination process.

Meanwhile, in this embodiment, the control unit 200 may be configured to change the third reference value and/or the fourth reference value depending on whether between the battery bank 10 commonly extracted at the first time point T1 and the second time point T2 and another battery bank 10, both the condition (first condition) where the voltage difference at the first time point T1 is smaller than the first reference value and the condition (second condition) that the voltage difference at the second time point T2 is smaller than the second reference value are satisfied or only one of both conditions is satisfied.

For example, if both the first condition and the second condition are satisfied in this embodiment, the third reference value and the fourth reference value may be configured to be lower compared to the case where both conditions are not satisfied. In other words, if the voltage difference at the first time point T1 is smaller than the first reference value and simultaneously the voltage difference at the second time point T2 is smaller than the second reference value, the third reference value and fourth reference value may be set higher compared to the case where the voltage difference at the first time point T1 is smaller than the first reference value but the voltage difference at the second time point T2 is greater than or equal to the second reference value, or the case where the voltage difference at the first time point T1 is greater than or equal to the first reference value but the voltage difference at the second time point T2 is smaller than the second reference value. In addition, the reference values may be changed or set by the control unit 200.

According to this configuration of the present disclosure, a failure may be determined more accurately and efficiently by comparing the case where the commonly extracted battery bank 10 has a high probability of failure with the case where it is not and then appropriately changing the third reference value and the fourth reference value.

In addition, in this embodiment, in order to determine the state of each battery bank 10 during the rest period, the control unit 200 may be configured to change whether or not to wake up at least some components of the battery diagnosing apparatus according to the present disclosure or change the wake-up period thereof.

For example, in a state where charging and discharging of the battery pack are finished, namely in the rest period state, the state measuring unit 100 and the control unit 200 may be basically maintained in a sleep mode state, and if charging and discharging starts, the state measuring unit 100 and the control unit 200 may be shifted to a wake-up mode. At this time, the control unit 200 may be configured to wake up at a predetermined interval in the rest period state, if the battery banks 10 extracted at the first time point T1 and the second time point T2 are identical and the difference between the voltage value at the first time point T1 and/or the second time point T2 of the commonly extracted battery bank 10 and the voltage value of another battery bank 10 is smaller than the first reference value and/or the second reference value. In addition, the wake-up control unit 200 may also allow the state measuring unit 100 to wake up.

As another example, in the rest period state of the battery pack, the state measuring unit 100 and the control unit 200 may be configured to be basically in a sleep mode and periodically wake up. At this time, the control unit 200 may be configured so that the wake-up period is shortened in the rest period state, if the battery banks 10 extracted at the first time point T1 and the second time point T2 are identical and the difference between the voltage value at the first time point T1 and/or the second time point T2 for the commonly extracted battery bank 10 and the voltage value of another battery bank 10 is smaller than the first reference value and/or the second reference value.

For example, in the rest period state of the battery pack, the state measuring unit 100 and the control unit 200 may be configured to basically wake up at every 10 seconds to perform the function. However, in the charging process and the discharging process of the battery pack, if the battery banks 10 extracted at the first time point T1 and the second time point T2 are identical as the second bank B2 but the difference between the voltage value of the second bank B2 at the first time point T1 and/or the second time point T2 and the voltage value of another battery bank 10 is smaller than the first reference value and/or the second reference value, the state measuring unit 100 and the control unit 200 may be configured to wake up at faster intervals, for example at every 5 seconds.

According to this configuration of the present disclosure, if there is a battery bank 10 that is not determined as having a failure during the charging process and the discharging process but is determined as having a high probability of failure, the state may be measured more often during the rest period state. Therefore, in this case, it may be possible to more quickly and accurately verify whether the battery bank 10 has a failure.

Moreover, at least some components of the battery diagnosing apparatus according to the present disclosure may be implemented as a battery management system (BMS) generally included in the battery pack. In this case, the wake-up operation in this embodiment may be understood as wake-up of the BMS.

Meanwhile, in the various embodiments, big data or deep learning technology may be employed for configurations to change at least one reference value among the first to fourth reference values or change the wake-up period. For example, the first reference value and the second reference value may be changed based on big data technology.

Meanwhile, the first time point T1 and the second time point T2, based on which the battery is extracted during the charging process and the discharging process, may be set by the control unit 200. In particular, the control unit 200 may set a conversion time point between charging and discharging of the battery pack as the first time point T1 and the second time point T2. That is, the control unit 200 may set one of time points at which the battery pack changes from a charging situation to a discharging situation as the first time point T1. In addition, the control unit 200 may set one of time points at which the battery pack changes from a discharging situation to a charging situation as the second time point T2.

For example, in the embodiment of FIG. 3, the time point at which the battery pack changes from a charging situation to a discharging situation is Tb, and the control unit 200 may extract at least one battery bank 10 by comparing the measured voltage values of the battery banks 10 using the time point Tb as the first time point T1. Moreover, the control unit 200 may extract the battery bank 10 measured as having the greatest voltage value at the time point Tb.

In addition, in the embodiment of FIG. 3, the time point at which the battery pack changes from a discharging situation to a charging situation is Tc, and the control unit 200 may extract at least one battery bank 10 by comparing the measured voltage values of the battery banks 10 using the time point Tc as the second time point T2. For example, the control unit 200 may extract the battery bank 10 measured as having the smallest voltage value at the time point Tc.

According to this configuration of the present disclosure, it is possible to more easily extract the battery bank 10 at the first time point T1 and the second time point T2. That is, if an abnormality occurs in the connection state of a specific battery bank 10, the voltage difference with other battery banks 10 is often large at the time point with a highest voltage and the time point with a lowest voltage. Therefore, if the voltage is compared based on the time point at which charging and discharging are converted and the voltage difference is compared with a reference value, the comparison may be made more clearly. Thus, it is possible to more accurately determine whether the battery bank 10 has a failure.

As another example, the first time point T1 and the second time point T2 may be set as time points having a predetermined time difference from the conversion time point between charging and discharging. For example, the first time point T1, which is one time point during the charging process, may be set as a time point before a predetermined time, for example 1 second, from the time point converting from charging to discharging, as shown in FIG. 3. In addition, the second time point T2, which is one time point during the discharging process, may be set as a time point before a predetermined time, for example 1 second, from the time point converting from discharging to charging. The first time point T1 and the second time point T2 may be set differently in consideration of various factors such as specifications or operation type of the battery pack and characteristics of a device to which the battery pack is mounted.

In particular, the control unit 200 may set the first time point T1 and the second time point T2 to be located in a second half of the charging section and the discharging section. For example, in the embodiment of FIG. 3, the control unit 200 may set the first time point T1 to be located in the second half of the first charging section T0 to Tb, rather than the first half thereof. That is, the control unit 200 may allow the first time point T1 to be located closer to Tb than to T0 in a horizontal axis direction. In addition, the control unit 200 may set the second time point T2 to be located in the second half of the second charging section Tb to Tc, rather than the first half thereof. That is, the control unit 200 may allow the second time point T2 to be located closer to Tc than to Tb in the horizontal axis direction.

According to this configuration of the present disclosure, it is possible to compare the voltage values in a section where a battery bank having a fast charging speed or a fast discharging speed due to a failure of the internal connection state and the like may be securely measured to have a voltage difference from other battery banks. Therefore, in this case, the battery bank having a failure may be diagnosed more accurately.

In addition, the control unit 200 may set the first time point T1 or the second time point T2 as a plurality of time points belonging to different charging or discharging stages. This will be described in more detail with reference to FIG. 6. However, hereinafter, features different from the former embodiments will be described in detail, and features similar or identical to the former embodiments will not be described in detail.

Figure 6:
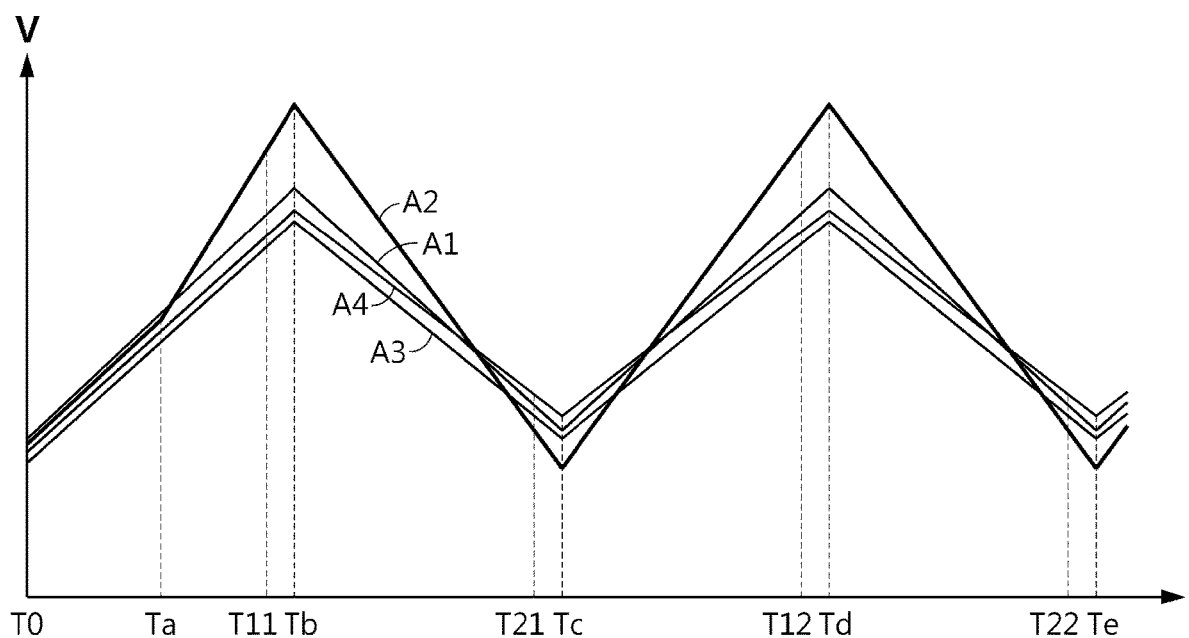
FIG. 6 is a graph schematically showing an example of a voltage measurement result measured by a state measuring unit of a battery diagnosing apparatus according to another embodiment of the present disclosure.

FIG. 6 is a graph schematically showing an example of a voltage measurement result measured by the state measuring unit 100 of a battery diagnosing apparatus according to another embodiment of the present disclosure.

Referring to FIG. 6, the first charging section may be referred to as a period between T0 and Tb, and the first discharging section may be referred to as a period between Tb and Tc. In addition, the second charging section may be referred to as a period between Tc and Td, and the second discharging section may be referred to as a period between Td and Te. Here, the control unit 200 may set the first time point in each of the first charging section T0 to Tb and the second charging section Tc to Td. That is, the control unit 200 may set a first-section first time point T11 in the first charging section T0 to Tb and a second-section first time point T12 in the second charging section Tc to Td. In addition, the control unit 200 may set the second time point in each of the first discharging section Tb to Tc and the second discharging section Td to Te. That is, the control unit 200 may set a first-section second time point T21 in the first discharging section Tb to Tc and a second-section second time point T22 in the second discharging section Td to Te. In addition, the control unit 200 may extract at least one battery bank 10 at each of the two first time points T11 and T12 and the two second time points T21 and T22. The features of the former embodiments may be applied to the configuration of extracting a specific battery bank 10 at each time point. For example, the control unit 200 may extract the battery bank 10 at each time point T11, T12, T21, T22 by comparing voltage values at each time point T11, T12, T21, T22.

When a plurality of first time points are set in different charging sections and/or a plurality of second time points are set in different discharging sections as above, if the battery banks 10 extracted at all of the first time points and the second time points are identical to each other, the control unit 200 may determine that the corresponding battery bank 10 has a failure in the connection state. For example, in the embodiment of FIG. 6, if the battery banks 10 extracted at two first time points T11, T12 and two second time points T21, T22 are all the second bank B2, the control unit 200 may determine that the battery bank B2 has a failure. Meanwhile, if the battery bank 10 extracted at any one of the four time points T11, T12, T21, T22 is different from the battery banks 10 extracted at the other three time points, the control unit 200 may determine that there is no battery bank 10 having a failure.

According to this configuration of the present disclosure, the connection state failure of the battery bank 10 may be diagnosed more accurately. For example, according to this embodiment, even though the charging voltage and the discharging voltage of a specific battery bank 10 are measured highest or lowest in some charging and discharging sections, if the charging voltage and the discharging voltage are recovered into a normal range in other sections, it may be diagnosed that the corresponding battery bank 10 has no failure in the connection state. This is because the voltage measurement result of a specific battery bank 10 may be caused by a temporary error. Therefore, according to the above configuration, the accuracy and reliability of the battery diagnosing apparatus according to the present disclosure may be further improved.

The control unit 200 of the battery diagnosing apparatus according to the present disclosure may distinguish a battery bank 10 including a battery cell 11 having a failure in open state. This will be described in more detail with reference to FIG. 7.

Figure 7:
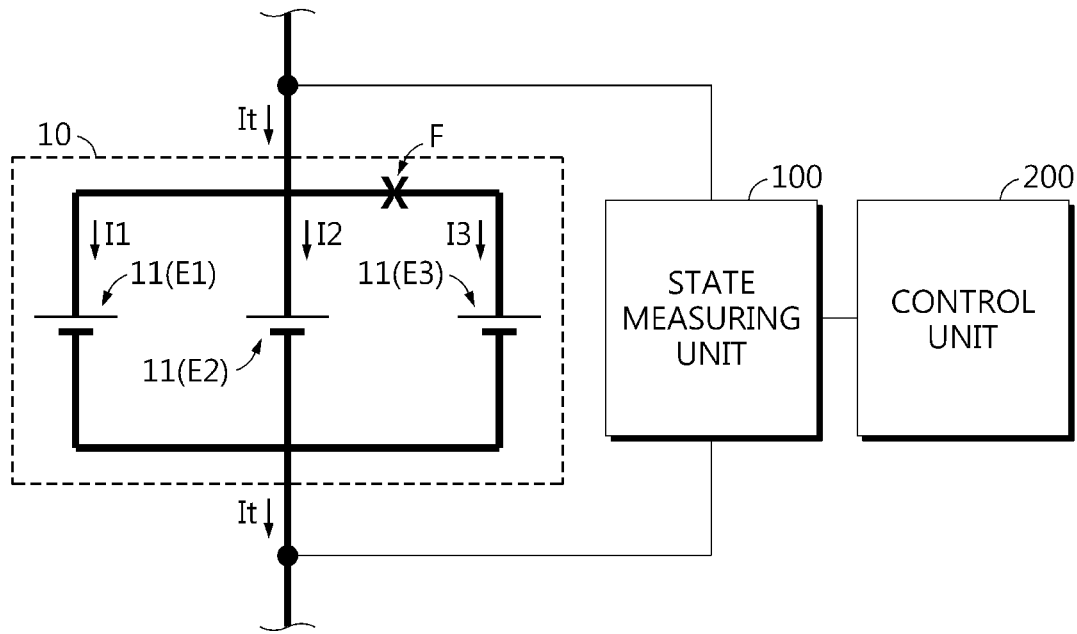
FIG. 7 is a diagram schematically showing an example of a battery bank connected to the battery diagnosing apparatus according to an embodiment of the present disclosure.

FIG. 7 is a diagram schematically showing an example of the battery bank 10 connected to the battery diagnosing apparatus according to an embodiment of the present disclosure.

Referring to FIG. 7, three battery cells 11, namely a first cell E1, a second cell E2 and a third cell E3, may be included in one battery bank 10 to be connected in parallel. In this configuration, if a charging current It is introduced into one battery bank 10, the charging current may be distributed and introduced into each of the three battery cells 11. However, if the parallel connection of the third cell E3 is damaged as indicated by F, namely if a failure occurs in open state, the entire charging current It is not introduced to the third cell E3, which may become I3=0. In addition, since the entire charging current It is introduced only to the first cell E1 and the second cell E2, I1 and I2 become higher compared to the time point before the third cell E3 is damaged. Therefore, if the state measuring unit 100 measures the voltage at both ends of the corresponding battery bank 10, the voltage measurement value may increase. For example, in the graph of FIG. 3, the voltage change at the time point T1 may be regarded as being caused by the open failure of a specific battery cell 11. Therefore, the control unit 200 may accurately distinguish which bank is the battery bank 10 includes the battery cell 11 having an open failure.

Meanwhile, the state measuring unit 100 may measure a temperature of each battery bank 10. In addition, the control unit 200 may extract each battery bank 10 at two or more time points based on the temperature of each battery bank 10. In addition, the control unit 200 may distinguish the battery bank 10 having a failure in the internal connection state depending on whether the battery banks 10 respectively extracted at the time points are identical to each other.

That is, the control unit 200 may extract one battery bank 10 by comparing the temperatures of the battery banks 10 during the charging process of the battery pack. In addition, the control unit 200 may extract one battery bank 10 by comparing the temperatures of the battery banks 10 during the discharging process of the battery pack.

In the embodiment in which the battery banks 10 are extracted based on the temperature of each battery bank 10 and the extracted battery banks 10 are compared to distinguish the battery bank 10 having a failure in the connection state, the features of the former embodiment, namely the feature of diagnosing the connection state of the battery bank 10 based on the voltage of each battery bank 10 may be applied in a similar way. That is, if the voltage of the former voltage-based embodiment is replaced by temperature, the embodiment for diagnosing the connection state of the battery bank 10 based on the temperature of each battery bank 10 may be described.

For example, in the embodiment of FIG. 3, if the vertical axis indicates temperature instead of voltage, the description related to FIG. 3 may be similarly applied. For example, the control unit 200 may extract one battery bank 10 using the temperature value of each battery bank 10 measured at the first time point T1 during the charging process of the battery pack, and extract one battery bank 10 using the temperature value of each battery bank 10 measured at the second time point T2 during the discharging process of the battery pack. In addition, if the battery banks 10 respectively extracted at the first time point T1 and the second time point T2 are identical to each other, it may be determined that the extracted battery bank 10 has a failure in the connection state.

Moreover, the control unit 200 may extract the battery bank 10 having a highest temperature value at the first time point T1 and extract the battery bank 10 having a lowest temperature value at the second time point T2. In addition, the control unit 200 may determine whether the battery banks 10 respectively extracted at the first time point T1 and the second time point T2 are identical to each other, and determine that a failure occurs in the internal connection state of the corresponding battery bank 10 if the extracted battery banks 10 are identical to each other.

In particular, if the difference between the temperature value at the first time point T1 of the battery bank 10 extracted at the first time point T1 and the temperature value at the first time point T1 of another battery bank 10 is greater than or equal to a first reference temperature value and the difference between the temperature value at the second time point T2 of the battery bank 10 extracted at the second time point T2 and the temperature value at the second time point T2 of another battery bank 10 is greater than or equal to a second reference temperature value, the control unit 200 may determine that the extracted battery bank 10 has a failure.

Also, the control unit 200 may compare the difference between the highest measured temperature value and the second highest measured temperature value at the first time point T1 with the first reference temperature value, and compare the difference between the lowest measured temperature value and the second lowest measured temperature value at the second time point T2 with the second reference temperature value.

Also, during the charging process and the discharging process of the battery pack, the control unit 200 may compare the temperatures of the battery banks 10 by setting one of the time points changing from a charging situation to a discharging situation as the first time point T1, and compare the temperatures of the battery banks 10 by setting one of the time points changing from a discharging situation to a charging situation as the second time point T2.

In addition, also in the embodiment of FIG. 6, the control unit 200 may also diagnose the connection state of the battery bank 10 based on temperature instead of voltage. That is, the control unit 200 may extract the battery bank 10 based on the temperature measured at each of the first time points T11, T12 respectively set in a plurality of charging steps and/or the second time points T21, T22 respectively set in a plurality of discharging steps, and diagnose whether the battery bank 10 has a failure by comparing whether the extracted battery banks 10 are identical to each other.

In the battery pack including a plurality of battery banks 10, as shown in FIG. 7, if there is a battery bank 10 in which the parallel connection of some battery cells 11 is cut, the current may be concentrated on a battery cell 11 that is normally connected inside the battery bank 10. Therefore, in the charging process and the discharging process of the battery pack, the temperature of the battery bank 10 may be changed greater. In the above configuration of the present disclosure, based on this point, it is possible to effectively diagnose whether a specific battery bank 10 has a damage in the internal connection by measuring the temperature of each battery bank 10.

Meanwhile, as in this embodiment, the configuration for determining whether the battery bank 10 has a failure based on the temperature of each battery bank 10 may be included together with the configuration for determining whether the battery bank 10 has a failure based on the voltage of each battery bank 10.

For example, if the battery banks 10 extracted during the charging process and the discharging process based on the voltage of each battery bank 10 and the battery banks 10 extracted during the charging process and the discharging process based on the temperature of each battery bank 10 are identical to each other, it may be determined that the corresponding battery bank 10 includes a cell with an open failure.

According to this configuration of the present disclosure, since the battery bank 10 having a problem is diagnosed by considering both the voltage and the temperature of the battery bank 10, the accuracy and reliability of the diagnosis may be remarkably improved.

In addition, the control unit 200 may diagnose whether the battery bank 10 has a failure based on a state change rate of each battery bank 10 during the charging process and the discharging process of the battery pack. This will be described in more detail with reference to FIG. 8.

Figure 8:
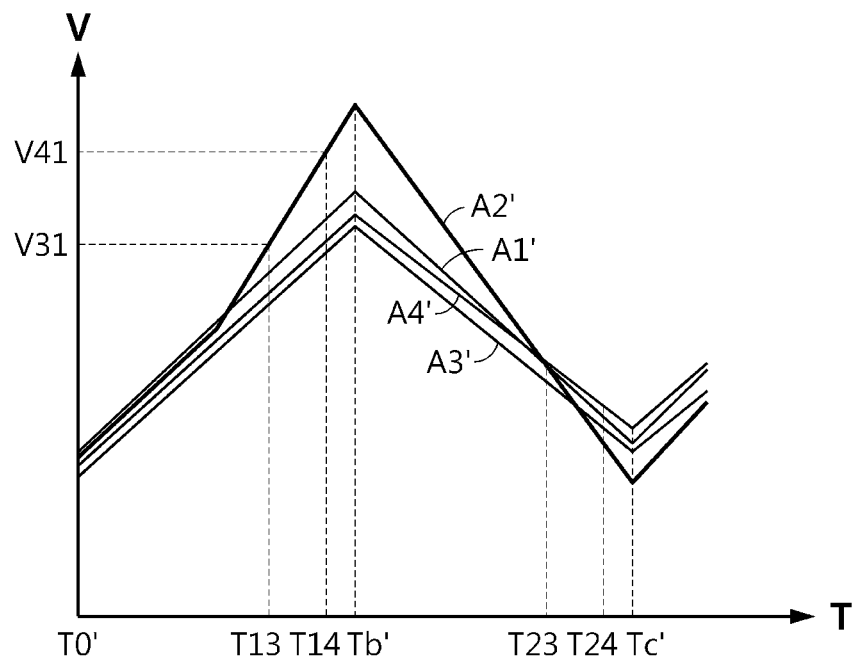
FIG. 8 is a graph schematically showing an example of a voltage measurement result measured by a state measuring unit of a battery diagnosing apparatus according to still another embodiment of the present disclosure.

FIG. 8 is a graph schematically showing an example of a voltage measurement result measured by the state measuring unit 100 of a battery diagnosing apparatus according to still another embodiment of the present disclosure. In FIG. 8, the graphs A1', A2', A3' and A4' may represent voltage measurement results corresponding to the first bank B1, the second bank B2, the third bank B3 and the fourth bank B4 included in the battery pack.

Referring to FIG. 8, the control unit 200 may compare the state change rates of the battery banks B1 to B4 in a predetermined section of each of the charging process and the discharging process of the battery pack. In addition, the control unit 200 may extract the battery banks 10 based on the state change rate respectively in the charging process and the discharging process of the battery pack, and compare and determine whether the extracted battery banks 10 are identical to each other. In particular, the control unit 200 may determine whether the battery banks 10 having a highest state change rate respectively in the charging process and the discharging process are identical to each other. In addition, if the battery banks 10 having the highest state change rate are identical to each other, the control unit 200 may determine that the corresponding battery bank 10 has a failure in the connection state.

For example, referring to the graph of FIG. 8, the control unit 200 may calculate the voltage change rate over time, with respect to voltage values V31, V41 of the battery banks 10 measured at two preset first time points T13, T14 in the charging section T0' to Tb' of the battery pack.

For example, the control unit 200 may calculate a voltage change rate (ΔVc) for two first time points T13, T14, with respect to the second bank B2, based on the graph A2' of FIG. 8 as follows.

$$\Delta Vc = (V41 - V31)/(T14 - T13)$$

Also, the control unit 200 may also calculate a voltage change rate for two first time points T13, T14, with respect to another battery bank 10, namely each of the first bank B1, the third bank B3 and the fourth bank B4, based on the graphs A1', A3' and A4' of FIG. 8.

In addition, the control unit 200 may extract the battery bank 10 having a highest voltage change rate by comparing the voltage change rates obtained in the charging process for each battery bank 10 as described above. For example, since the change rate of the graph A2' is greatest in the section T13 to T14 in the embodiment of FIG. 8, the control unit 200 may designate the second bank corresponding to the graph A2' as the battery bank 10 extracted in the charging step.

Also, in a similar manner, the control unit 200 may calculate the voltage change rate over time with respect to the voltage value of each battery bank 10 measured at two preset second time points T23, T24 during the discharging section Tb' to Tc' of the battery pack.

In addition, the control unit 200 may extract the battery bank 10 having a greatest change rate among the voltage change rates between two second time points T23, T24. For example, in the graph of FIG. 8, the second bank B2 corresponding to the graph A2' may be extracted as the battery bank 10 having the greatest change rate.

As described above, if the battery banks 10 having the highest state change rate in the charging process and the discharging process are identical as the second bank B2, the control unit 200 may determine that the second bank B2 has a failure in the internal connection state.

Meanwhile, the battery diagnosing apparatus according to an embodiment of the present disclosure may further include a storage unit 300 as shown in FIG. 1.

The storage unit 300 may store programs and data necessary for the control unit 200 to diagnose the connection state of the battery bank 10. That is, the storage unit 300 may store data or program required for each component of the battery diagnosing apparatus according to an embodiment of the present disclosure to perform an operation or function, or data generated while performing the operation and function. For example, the storage unit 300 may store data necessary for the control unit 200 to diagnose a battery bank 10 having a failure, for example the first time point, the second time point, the first reference value, the second reference value and the like.

The storage unit 300 may employ any known information storage means known in the art as being capable of recording, erasing, updating and reading data, without any limitation in kind. As an example, the information storage means may include random-access memory (RAM), flash memory, read-only memory (ROM), electrically erasable programmable read-only memory (EEPROM), register or the like. In addition, the storage unit 300 may store program codes in which processes executable by the control unit 200 are defined.

In addition, the battery diagnosing apparatus according to an embodiment of the present disclosure may further include an alarm unit 400, as shown in FIG. 1.

When a failure of a specific battery bank 10 is distinguished by the control unit 200, the alarm unit 400 may be configured to notify the failure to a user such as a vehicle driver or a system manager. To this end, the alarm unit 400 may include a display unit such as a monitor or a warning lamp, or may include a voice output unit such as a speaker. Alternatively, the alarm unit 400 may include a transmission unit or the like for transmitting the fact that the battery bank 10 has a failure to a terminal or server outside the battery pack.

As shown in FIG. 1, the battery pack according to the present disclosure may include the battery diagnosing apparatus according to the present disclosure as described above. In particular, in the battery pack according to the present disclosure, some components of the battery diagnosing apparatus, for example the control unit 200, may be implemented using a BMS provided to a conventional battery pack. In addition, the battery pack according to the present disclosure may further include a plurality of battery banks 10 in which one or more secondary batteries are connected in parallel. Moreover, the battery pack according to the present disclosure may further include electronic components (including a relay, a fuse, or the like) and a pack case.

In addition, the battery diagnosing apparatus according to the present disclosure may be mounted to a vehicle, particularly an electric vehicle. That is, the vehicle according to the present disclosure may include the battery diagnosing apparatus according to the present disclosure. Here, the battery diagnosing apparatus may be included in the battery pack, but some components may be implemented as a device separate from the battery pack. For example, the control unit 200 of the battery diagnosing apparatus may be implemented using an electronic control unit (ECU) of the vehicle. In addition, the vehicle according to the present disclosure may include a vehicle body or electronic components that are typically provided to the vehicle, in addition to the battery diagnosing apparatus. For example, the vehicle according to the present disclosure may include a battery, a contactor, an inverter, a motor, at least one ECU and the like, in addition to the battery diagnosing apparatus according to the present disclosure. However, the present disclosure is not particularly limited in relation to components of the vehicle other than the battery diagnosing apparatus.

Figure 9:
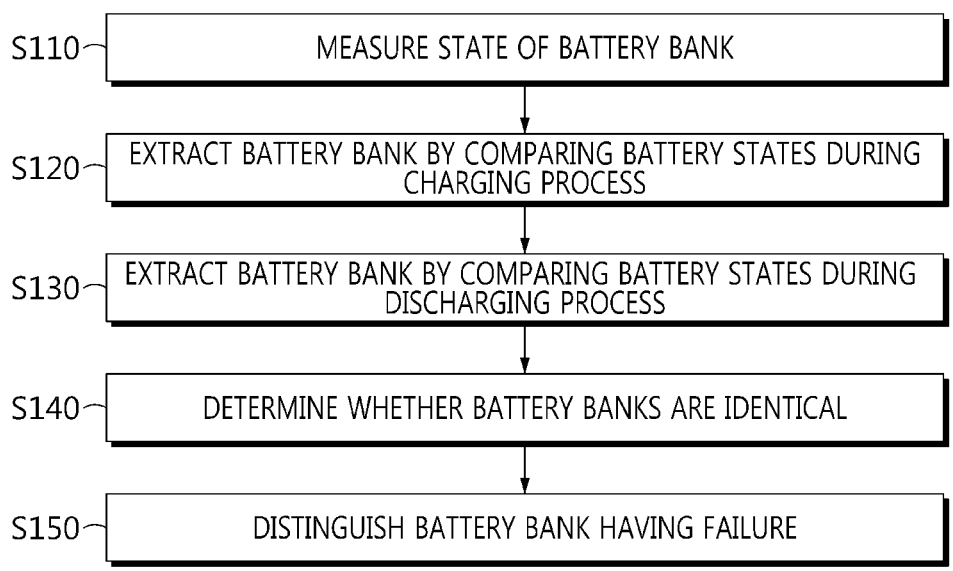
FIG. 9 is a flowchart schematically showing a battery diagnosing method according to an embodiment of the present disclosure.

FIG. 9 is a flowchart schematically showing a battery diagnosing method according to an embodiment of the present disclosure. In FIG. 9, each step may be performed by each component of the battery diagnosing apparatus described above.

The battery diagnosing method according to the present disclosure may be a method of diagnosing a connection state of a battery pack in which a plurality of battery banks respectively having a plurality of battery cells 11 connected in parallel are included and connected in series with each other.

As shown in FIG. 9, in the battery diagnosing method according to the present disclosure, first, during the charging process and the discharging process of the battery pack, a state of each battery bank included in the battery pack is measured (S110). For example, in Step S110, a voltage of each battery bank may be measured.

Next, the states of the battery banks measured during the charging step in Step S110 are compared with each other to extract at least one battery bank (S120). For example, in Step S120, a battery bank having a highest voltage value at a specific time point or section of the charging process may be extracted.

In addition, the states of the battery banks measured during the discharging step in Step S110 are compared with each other to extract at least one battery bank (S130). For example, in Step S130, a battery bank having a lowest voltage value at a specific time point or section of the discharging process may be extracted. Meanwhile, even though FIG. 9 depicts that Step S130 is performed after Step S120, Step S130 may also be performed before or simultaneously with Step S120.

Next, it may be determined whether the battery banks extracted in Step S120 and Step S130 are identical to each other (S140). That is, in Step S140, it may be determined whether the battery bank extracted in the charging process and the battery bank extracted in the discharging process are identical to each other.

In addition, based on the determination of Step S140, a battery bank having a failure in the connection state may be distinguished (S150). That is, if the battery banks respectively extracted in the charging process and the discharging process are identical to each other, it may be determined that the extracted battery bank has a failure in the connection state.

In each step of the battery diagnosing method according to the present disclosure, the description of each component of the battery diagnosing apparatus described above may be applied in a similar way and thus will not be described in detail.

Meanwhile, in the various embodiments, each battery bank 10 has been described as having a plurality of battery cells 11 connected in parallel, but the present disclosure is not necessarily limited to the embodiment.

FIG. 10 is a diagram schematically showing a battery diagnosing apparatus according to another embodiment of the present disclosure. For this embodiment, features different from the former embodiments will be described in detail, and features similar or identical to the former embodiments will not be described in detail.

Referring to FIG. 10, in the battery diagnosing apparatus according to the present disclosure, each battery bank 10 may include a plurality of battery modules M connected in parallel. That is, the battery diagnosing apparatus according to another embodiment of the present disclosure may be an apparatus for diagnosing the connection state of the battery pack including a plurality of battery banks 10 respectively having a plurality of battery modules M connected in parallel. In this case, each battery module M may include a plurality of secondary batteries electrically connected in series and/or in parallel with each other.

In this embodiment, the features of the former embodiments may be applied identically or similarly, except that each battery bank 10 does not include a plurality of battery cells 11 connected in parallel but includes a plurality of battery modules M connected in parallel instead. Therefore, for this embodiment, various features disclosed above may be described identically or similarly just by substituting the battery cell 11 with the battery module M.

For example, in the former embodiment, it has been described that the control unit 200 distinguishes the battery bank 10 that includes a battery cell 11 having a failure in open state. Similarly, in this embodiment, the control unit 200 may be described as distinguishing the battery bank 10 that includes a battery module M having a failure in open state.

In addition, according to another embodiment of the present disclosure, the battery diagnosing apparatus according to the present disclosure may be an apparatus for diagnosing a connection state of a battery system including a plurality of battery banks 10 respectively having a plurality of battery packs connected in parallel.

That is, the battery diagnosing apparatus according to the present disclosure may diagnose the connection state of a battery system including a plurality of battery banks 10, and each battery bank 10 may include a plurality of battery packs connected in parallel. In this embodiment, the battery pack includes a plurality of secondary batteries, like the battery module M of the former embodiment, but may further include a control unit such as a battery management system (BMS) in addition to the battery module M. In addition, each battery pack may further include electrical components such as a relay, a fuse, and a current sensor. In addition, each battery pack may include one battery module M or a plurality of battery modules M. In addition, each battery pack may include a pack case for accommodating the battery module M, the electrical components, the BMS and the like.

In this embodiment, the features of the former embodiments may be applied identically or similarly, if the battery cell 11 or the battery module M of the former embodiments is replaced with a battery pack. In particular, recently, a battery system in which a plurality of battery packs are connected in parallel is implemented in the form of a battery system adopted in a vehicle or an energy storage system, and the battery diagnosing apparatus according to the present disclosure may be applied to the battery system.

Meanwhile, in this specification, the term '. . . unit' such as 'the state measuring unit' and 'the control unit' is used, but these components should be understood as being functionally distinguished from each other, rather than being physically distinguished. For example, each component may be selectively integrated with another component, or each component may be divided into sub-components for efficiently executing control logic(s). In addition, it is obvious to those skilled in the art that even though components are integrated or divided, as long as the same function can be recognized, the integrated or divided components should be interpreted as falling within the scope of the present disclosure.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

10: battery bank
11: battery cell
100: state measuring unit
200: control unit
300: storage unit
400: alarm unit

What is claimed is:

1. A battery diagnosing apparatus for diagnosing a connection state of a battery pack that includes a plurality of battery banks, each battery bank including a respective plurality of battery modules connected in parallel to one another, each battery module including one or more battery cells, the battery diagnosing apparatus comprising:
   one or more sensors configured to measure one or more properties of each battery bank during each of a charging process and a discharging process of the battery pack; and
   a control unit configured to:
      determine which one of the plurality of battery banks has a greatest voltage value among the plurality of battery banks at a first time point during the charging process of the battery pack based on the one or more measured properties of the battery banks measured during the charging process of the battery pack,
      determine which one of the plurality of battery banks has a smallest voltage value among the plurality of battery banks at a second time point during the discharging process of the battery pack based on the one or more measured properties of the battery banks measured during the discharging process of the battery pack,
      determine a failure in a connection state of at least one battery bank of the plurality of battery banks based on a same battery bank being determined to have the greatest voltage at the first time point and the smallest voltage at the second time point, and
      turn off a charging/discharging path of the battery pack based on the determined failure in the connection state of the at least one battery bank.

2. The battery diagnosing apparatus according to claim 1, wherein the control unit is configured to:
   determine that the at least one battery bank has a failure in response to:
   a difference between: (i) the voltage value at the first time point of the at least one battery bank; and (ii) a voltage value at the first time point of a different battery bank of the plurality of battery banks being greater than or equal to a first reference value; and
   a difference between (i) the voltage value at the second time point of the at least one battery bank; and (ii) a voltage value at the second time point of a different battery bank of the plurality of battery banks being greater than or equal to a second reference value.

3. The battery diagnosing apparatus according to claim 2, wherein the control unit is configured to:
   compare a difference between the voltage value of the at least one battery bank to a voltage value of a next-rank battery bank at the first time point with the first reference value; and
   compare a difference between the voltage value of the at least one battery bank to a voltage value of a next-rank battery bank at the second time point with the second reference value.

4. The battery diagnosing apparatus according to claim 2, wherein the one or more sensors are configured to measure a temperature of the battery pack, and
   the control unit is configured to change the first reference value and the second reference value according to the temperature of the battery pack measured by the one or more sensors.

5. The battery diagnosing apparatus according to claim 2, wherein the control unit is configured to determine failure of the at least one battery bank based on a measured property of each battery bank of the plurality of battery banks during a process other than the charging process and the discharging process, in response to:
   a difference between the voltage value at the first time point of the at least one battery bank and a voltage value at the first time point of a different battery bank being smaller than the first reference value; or
   a difference between the voltage value at the second time point of the at least one battery bank and a voltage value at the second time point of a different battery bank being smaller than the second reference value.

6. The battery diagnosing apparatus according to claim 1, wherein the charging process switches to the discharging process at the first time point and the discharging processes switches to the charging process at the second time point.

7. The battery diagnosing apparatus according to claim 1, wherein the connection state of the at least one battery bank is an open state.

8. The battery diagnosing apparatus according to claim 1, wherein the one or more sensors are configured to measure a temperature of each battery bank, and
   the control unit is configured to:
   designate the battery bank having the greatest voltage value among the plurality of battery banks at the first time point based on a respective temperature of each of the plurality of battery banks measured during the charging process of the battery pack; and
   designate the battery bank having the smallest voltage value among the plurality of battery banks at the second time point based on a respective temperature of each of the plurality of battery banks measured during the discharging process of the battery pack.

9. The battery diagnosing apparatus according to claim 1, wherein the control unit is configured to compare state change rates of the plurality of battery banks during the charging process and the discharging process of the battery pack with each other; and
   determine the failure in the connection state of the at least one battery bank based on the at least one battery bank having a highest state change rate during both the charging process and the discharging process.

10. A battery pack, comprising the battery diagnosing apparatus according to claim 1.

11. A battery diagnosing apparatus for diagnosing a connection state of a battery system that includes a plurality of battery banks, the battery diagnosing apparatus comprising:
    one or more sensors configured to measure one or more properties of each battery bank during each of a charging process and a discharging process of the battery system; and
    a control unit configured to:
       determine which one of the plurality of battery banks has a greatest voltage value among the plurality of battery banks at a first time point during the charging process of the battery pack based on the one or more measured properties of the battery banks measured during the charging process of the battery pack,
       determine which one of the plurality of battery banks has a smallest voltage value among the plurality of battery banks at a second time point during the discharging process of the battery pack based on the one or more measured properties of the battery banks measured during the discharging process of the battery pack, determine a failure in a connection state of at least one battery bank of the plurality of battery banks based on a same battery bank being determined to have the greatest voltage at the first time point and the smallest voltage at the second time point, and turn off a charging/discharging path of the battery pack based on the determined failure in the connection state of the at least one battery bank.

12. A battery diagnosing method for diagnosing a connection state of a battery pack that includes a plurality of battery banks, each battery bank including a plurality of respective battery cells connected in parallel to one another, the battery diagnosing method comprising:

measuring one or more properties of each battery bank during each of a charging process and a discharging process of the battery pack;

determining, by a control unit, which one of the plurality of battery banks has a greatest voltage value among the plurality of battery banks at a first time point during the charging process of the battery pack based on the one or more measured properties of the battery banks measured during the charging process of the battery pack;

determining, by the control unit, which one of the plurality of battery banks has a smallest voltage value among the plurality of battery banks at a second time point during the discharging process of the battery pack based on the one or more measured properties of the battery banks measured during the discharging process of the battery pack;

determining, by the control unit, a failure in a connection state of at least one battery bank of the plurality of battery banks based on a same battery bank being determined to have the greatest voltage at the first time point and the smallest voltage at the second time point; and turning off a charging/discharging path of the battery pack based on the determined failure in the connection state of the at least one battery bank.

13. The battery diagnosing apparatus according to claim 1, further comprising:

an alarm unit, and wherein the control unit is configured to control the alarm unit to notify the failure based on determination of the failure in the connection state.

* * * * *